(12) United States Patent
Chenakin

(10) Patent No.: US 8,373,463 B1
(45) Date of Patent: Feb. 12, 2013

(54) LOW PHASE-NOISE PLL SYNTHESIZER WITH FREQUENCY ACCURACY INDICATOR

(75) Inventor: Oleksandr Chenakin, San Jose, CA (US)

(73) Assignee: Phase Matrix, Inc., San Jose, CA (US)

(*) Notice: Subject to any disclaimer, the term of this patent is extended or adjusted under 35 U.S.C. 154(b) by 0 days.

(21) Appl. No.: 13/241,532

(22) Filed: Sep. 23, 2011

(51) Int. Cl.
*H03L 7/06* (2006.01)
(52) U.S. Cl. .................................. 327/156; 327/147
(58) Field of Classification Search .............. 327/147, 327/156
See application file for complete search history.

(56) References Cited

U.S. PATENT DOCUMENTS

| | | | |
|---|---|---|---|
| 4,105,949 A | 8/1978 | Hardin | |
| 4,604,583 A | 8/1986 | Aoyagi et al. | |
| 5,281,863 A * | 1/1994 | Bond et al. | 327/114 |
| 5,508,661 A | 4/1996 | Keane et al. | |
| 5,770,977 A | 6/1998 | Uurtamo | |
| 6,188,740 B1 | 2/2001 | Tomaru | |
| 6,282,249 B1 | 8/2001 | Tomesen et al. | |
| 6,373,344 B1 | 4/2002 | Mar | |
| 6,480,006 B1 | 11/2002 | Buckley | |
| 6,765,977 B1 | 7/2004 | Adams et al. | |
| 6,931,243 B2 * | 8/2005 | Goldman | 455/260 |
| 6,992,531 B2 | 1/2006 | Mar | |
| 7,012,453 B2 | 3/2006 | Coleman et al. | |
| 7,023,249 B1 | 4/2006 | Mulbrook | |
| 7,209,936 B2 | 4/2007 | Sullivan | |
| 7,321,268 B2 * | 1/2008 | Chang et al. | 331/37 |
| 7,369,002 B2 | 5/2008 | Spijker et al. | |
| 7,386,286 B2 * | 6/2008 | Petrovic et al. | 455/165.1 |
| 7,486,147 B2 | 2/2009 | Khorram | |
| 7,570,123 B2 | 8/2009 | Dent et al. | |
| 7,701,299 B2 | 4/2010 | Chenakin | |
| 2002/0196061 A1 * | 12/2002 | Atyunin et al. | 327/158 |
| 2009/0146708 A1 * | 6/2009 | Yun et al. | 327/158 |
| 2009/0309665 A1 * | 12/2009 | Chenakin | 331/25 |

OTHER PUBLICATIONS

Gao et al. "A Low Noise Sub-Sampling PLL in Which Divider Noise is Eliminated and PD/CP Noise is Not Multiplied by N2," IEEE Journal of Solid-State Circuits, vol. 44, No. 12, pp. 3253-3263, Dec. 1, 2009 (US).
Chiu et al. "A Dynamic Phase Error Compensation Technique for Fast-Locking Phase-Locked Loops," IEEE Journal of Solid-State Circuits, vol. 45, No. 6, pp. 1137-1149, Jun. 1, 2010 (US).
Chenakin, "A Compact Synthesizer Module Offers Instrument-Grade Performance and Functionality," Microwave Journal, vol. 54, issue 2, pp. 34-38 (three pages), Feb. 1, 2011 (US).

* cited by examiner

*Primary Examiner* — Adam Houston
(74) *Attorney, Agent, or Firm* — Meyertons Hood Kivlin Kowert & Goetzel, P.C.; Jeffrey C. Hood

(57) ABSTRACT

A phase-locked loop (PLL) frequency synthesizer includes a phase detector, a low pass filter coupled to the phase detector, an amplifier coupled to the low pass filter, a voltage controlled oscillator (VCO) coupled to the amplifier, a power splitter coupled to the VCO, and a switch configured to select between a first branch and a second branch through which to couple the power splitter to the phase detector. The first branch includes a frequency divider while the second branch includes a mixer. The PLL frequency synthesizer also includes a frequency accuracy indicator that compares a frequency in the first branch with a frequency generated in the second branch, and confirms that the PLL frequency synthesizer is locked to a desired frequency upon receiving a phase lock signal, if the frequency generated in the first branch is the same as the frequency generated in the second branch.

10 Claims, 1 Drawing Sheet

LOW PHASE-NOISE PLL SYNTHESIZER WITH FREQUENCY ACCURACY INDICATOR

TECHNICAL FIELD

The disclosure is related to the field of phase-locked loop (PLL) frequency synthesizers, and more specifically to the design of frequency accuracy indicators used with PLL frequency synthesizers.

BACKGROUND

A PLL synthesizer (U.S. Pat. No. 7,701,299) that achieves fast tuning speed and low phase-noise was recently introduced. This synthesizer has an initial tuning mechanism that uses a conventional divider loop to lock a voltage-controlled oscillator (VCO) to a desired output frequency. Once initial lock is achieved, the divider loop is switched out of the circuit in favor of a low phase-noise mixer loop.

The mixer loop provides a low phase-noise feedback path in the PLL. It produces a rich spectrum of regularly spaced frequencies and the PLL can potentially lock to any one of them. Normally, when the synthesizer switches from the divider loop to the mixer loop, the PLL output frequency does not change. This stability is obtained in part because the frequencies in the mixer loop are integer multiples of the phase detector comparison signal frequency. The integer division ratio in the divider branch may therefore be chosen to exactly match a multiplication coefficient in the mixer branch.

It is possible, however, that unusual circumstances could lead the synthesizer PLL to lock to an incorrect frequency in the mixer loop. Temporary failures of the PLL loop low-pass filter or loss of bias, for example, might lead the synthesizer to lock to the wrong frequency.

DETAILED DESCRIPTION

As previously mentioned, unusual circumstances could lead a PLL synthesizer (that achieves fast tuning speed and low phase-noise) to still lock to an incorrect frequency in the mixer loop. Hence, it may be beneficial to construct a frequency accuracy indicator that may be incorporated in or used with a PLL synthesizer to confirm that the PLL synthesizer is locked to the correct frequency.

The frequency accuracy indicator described below compares frequencies generated in different parts of a dual-branch, low phase-noise PLL synthesizer. The indicator continuously monitors whether or not the PLL synthesizer is locked to the correct frequency. Additionally, the frequency accuracy indicator may be combined with a conventional phase lock indicator to provide a signal that indicates whether or not the PLL is phase locked and at the correct frequency.

The "correct" or intended frequency is defined by a reference frequency source and the division ratio, N, in the divider loop of a dual-branch, low phase-noise PLL synthesizer. Following is a review of the of U.S. Pat. No. 7,701,299 to better understand how a frequency accuracy indicator may be operated with(in) a dual-branch PLL frequency synthesizer.

Dual-Branch, Low Phase-Noise PLL Synthesizer

Figure 1:
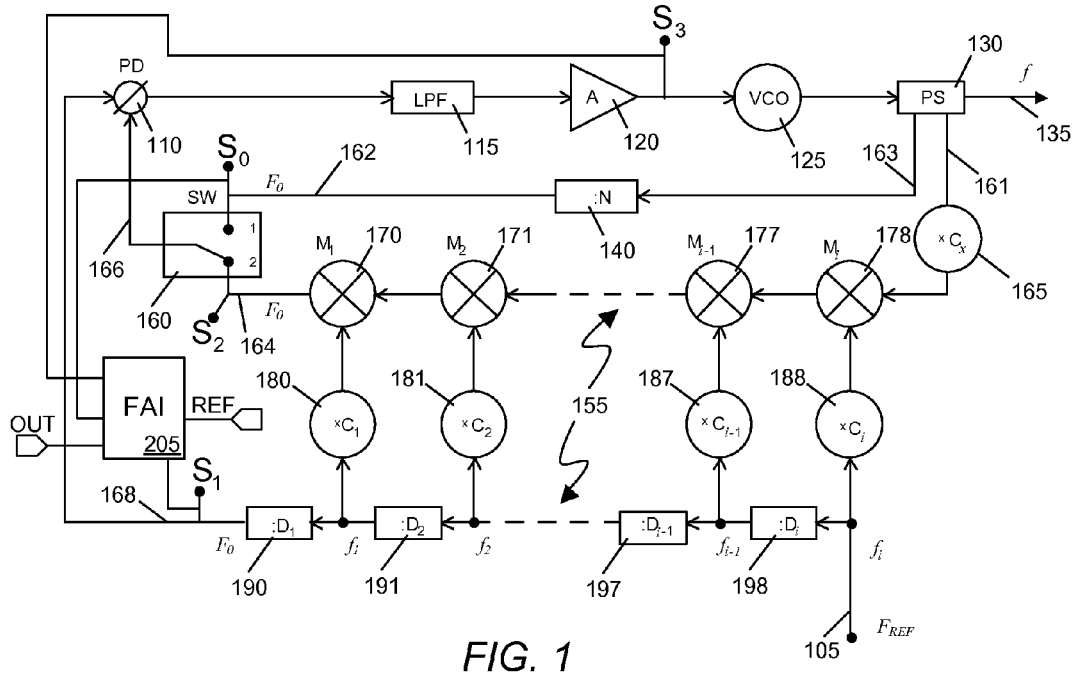
FIG. 1 is a simplified block diagram of one embodiment of a low phase-noise PLL synthesizer that includes a frequency accuracy indicator.

FIG. 1 is a simplified block diagram of a low phase-noise PLL synthesizer that also includes a frequency accuracy indicator (FAI) module. The circuit is based on a VCO that is locked in relationship to a reference frequency by either of two feedback loops. One loop is used for initial tuning, while another provides low phase-noise performance by removing all frequency dividers from the loop.

In the figure, an error signal generated by phase detector 110 is filtered by low-pass filter 115 and amplified by amplifier 120 before feeding voltage controlled oscillator (VCO) 125. A portion of the VCO output signal 135 is split off by power splitter 130 and returned to the phase detector after passing through either of two branches of a feedback loop selected by a switch.

Switch 160 selects either a conventional frequency divider loop or a frequency mixer system. A conventional loop comprising divider 140 is selected when switch 160 is in position "1" and is used for initial tuning. This loop includes components in the signal path between signals 163 and 162. A mixer system is selected when switch 160 is in position "2" and is used to achieve low phase-noise operation. This loop includes components in the signal path between signals 161 and 164.

In FIG. 1, the mixer system selected by position "2" of switch 160 is illustrated in generalized form. The mixer system comprises: mixers, such as mixers 170, 171, 177 and 178; frequency multipliers, such as multipliers 180, 181, 187 and 188; and frequency dividers, such as dividers 190, 191, 197 and 198. Each mixer has a corresponding multiplier and divider; however, the number of mixers used in a particular system may be one, two, several, or even as many as ten or more. For this reason, FIG. 1 shows mixers denoted $M_1$ through $M_i$ with corresponding multipliers $C_1$ through $C_i$ and dividers $D_1$ through $D_i$. Dotted lines 155 indicate that mixers with corresponding multipliers and dividers may be included in, or removed from, the circuit while maintaining the same architecture and principle of operation. The multipliers' multiplication factors ($C_1$ through $C_i$) and the dividers' division ratios ($D_1$ through $D_i$) are integers. The multipliers may be comb generators which output a large number of harmonics.

Reference frequency $F_{REF}$ 105 is a high-stability, low phase-noise reference signal. $F_{REF}$ is divided by dividers $D_1$ through $D_i$ to form phase detector comparison signal 168 ($F_0$), which is one input to phase detector 110. The phase detector compares $F_0$ with signal 166. Note that dividers 190, 191, 197 and 198, providing division ratios ($D_1$ through $D_i$), are not in the PLL feedback loop and are not in the signal path between signals 161 and 164. When switch 160 is in position "2" the VCO slews to a lock frequency given by:

$$f = F_0(D_1 D_2 \ldots D_{i-1} D_i C_i \pm D_1 D_2 \ldots D_{i-1} C_{i-1} \pm \ldots \pm D_1 D_2 C_2 \pm D_1 C_1 \pm 1).$$

Since all the division and multiplication coefficients are integers, $$f = F_0 \times N,$$

where $N = (D_1 D_2 \ldots D_{i-1} D_i C_i \pm D_1 D_2 \ldots D_{i-1} C_{i-1} \pm \ldots \pm D_1 D_2 C_2 \pm D_1 C_1 \pm 1)$ is an integer.

Possible frequencies output by the synthesizer of FIG. 1 are equally spaced by $F_0$. Switch 160 is set to position "1" to initially tune the synthesizer to one of the frequencies using a conventional divider feedback loop. A desired output frequency can be chosen exactly since divider 140 causes the feedback loop to lock to f=$F_0$×N where N is the division ratio of the divider and N may be chosen to exactly match an output of the mixer branch where:

$$N = (D_1 D_2 \ldots D_{i-1} D_i C_i \pm D_1 D_2 \ldots D_{i-1} C_{i-1} \pm \ldots \pm D_1 D_2 C_2 \pm D_1 C_1 \pm 1).$$

This design minimizes the chance of false lock; i.e. locking the loop to an incorrect frequency.

In the design of FIG. 1, the mixer branch does not generate undesired signal products within the synthesizer loop bandwidth. The output of each mixer includes a large number of products including the mixer RF and LO fundamental frequencies, their harmonics, the sums and differences of the RF and LO frequencies, and their harmonics given by:

$$f_{MIX} = \pm m f_{RF} \pm n f_{LO},$$

which may be written as:

$$f_{MIXi} = \pm m F_0 N \pm n F_0 D_1 D_2 \ldots D_{i-1} D_1 C_1$$

for mixer $M_i$. Assuming that all the coefficients are integers, the mixer products can be expressed as:

$$f_{MIXi} = k F_0$$

where k is an integer. Similarly, all harmonic and intermodulation products generated by the mixer branch are multiples of the phase detector comparison frequency $F_0$. These products are easily rejected by a loop low-pass filter. The loop filter bandwidth is made small enough to reject undesired signals, typically ten times less than $F_0$. The output of the PLL is therefore a desired frequency, f, within an effective band pass filter having a width narrower than $F_0$. This design ensures that spurious mixer products fall outside the loop filter bandwidth and are therefore easily removed.

Given a desired output frequency f and frequency resolution or step size $F_0$, the operation of the synthesizer proceeds as follows: Switch 160 is set to position "1" so that the initial-tuning divider branch is connected to, and the mixer branch is disconnected from, the phase detector. The divider ratio, N, of divider 140 is programmed to equal the ratio between the desired output frequency f and the step size $F_0$. The phase detector generates an error signal that tunes the VCO output to f. The phase detector also generates a lock-detect signal that switches switch 160 to position "2", thereby removing the divider branch from, and including the mixer branch in, the loop circuit. VCO output f is converted in the mixer branch to frequency $F_0$, the same frequency that was generated earlier in the divider branch. The phase detector relocks the output signal f; however, this time there is no frequency division in the feedback loop and phase-noise is reduced. Loop low-pass filter 115 removes undesired mixer products thereby ensuring low spurious emissions.

Optional multiplier 165, having multiplication factor $C_x$, may be placed in the feedback path between signals 161 and 164. Just as frequency division in the loop feedback path of a PLL synthesizer increases phase-noise by 20 log N, frequency multiplication in the loop feedback path reduces phase-noise by 20 log C, where C is the multiplication factor. Therefore 20 log $C_x$ lower phase-noise is obtained when multiplier 165 is included. Multiplication in the loop feedback path does lead to coarser frequency resolution; however, a desired frequency resolution may be achieved by including a sufficient number of mixers, $M_i$ (170-178).

Four connection points, $S_0$, $S_1$, $S_2$, and $S_3$ are shown in FIG. 1. These points indicate signal sources for the frequency accuracy indicator (FAI) 205 also shown in FIG. 1. FAI 205 is coupled to (or within, depending on the location of FAI 205) the PLL synthesizer at connection points $S_0$ and $S_1$, in addition to connection point $S_3$, as shown in FIG. 1. In alternate embodiments, FAI 205 may be coupled at connection points $S_0$ and $S_2$, instead of the $S_0$ and $S_1$ combination shown in FIG. 1. The frequency at connection points $S_1$ and $S_2$ in FIG. 1 is the same during normal synthesizer operation, so the choice of which one to use may be based on various secondary design considerations. The frequency at connection point $S_0$ is the frequency set by the divider loop, the so-called "correct" frequency. The frequency at connection point $S_1$ and/or $S_2$ is the frequency set by the mixer branch. The operation of one embodiment of FAI 205 receiving signals from connection points, $S_0$, $S_1$, $S_2$, and/or $S_3$ is described in more detail below.

Frequency Accuracy Indicator

The frequency accuracy indicator described below is used to detect whether or not the PLL synthesizer described above is operating at the correct frequency defined by reference frequency $F_{REF}$ 105 (as modified by dividers $D_1$ through $D_i$ to form phase detector comparison signal 168 ($F_0$) and the division ratio, N, of the divider loop. The frequency accuracy indicator may also indicate that the synthesizer is not merely operating at the correct frequency, but also that the PLL is locked at that frequency.

Figure 2A:
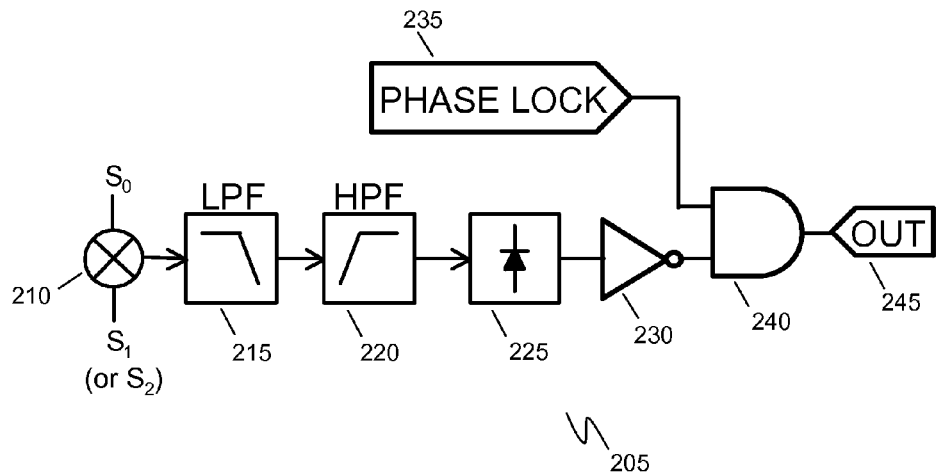
FIG. 2A is a simplified block diagram of one embodiment of the frequency accuracy indicator included in the low phase-noise PLL synthesizer of FIG. 1.

FIG. 2A is a simplified block diagram of one embodiment of frequency accuracy indicator 205 for the low phase-noise PLL synthesizer of FIG. 1. In FIG. 2A, mixer 210 mixes two inputs, labeled "$S_0$" and "$S_1$ (or $S_2$)" as shown, (and as established at the correspondingly labeled nodes shown in FIG. 1, as will be further discussed below). The mixer output passes through low pass filter (LPF) 215 and high pass filter (HPF) 220 before detection by detector 225. (In their simplest implementations, HPF 220 may be a capacitor and detector 225 may be a diode.) The resulting logic level is inverted by inverter 230. AND gate 240 combines the output of inverter 230 and a phase lock signal 235 to produce frequency accuracy indicator output signal 245.

Frequency accuracy indicator 205 detects whether or not its two mixer inputs are at the same frequency. Suppose that the two mixer input signals, $S_0$ and $S_1$, have frequencies $f_0$ and $f_1$, respectively. The output of mixer 210 will then contain sum and difference frequencies $f_0+f_1$ and $f_0-f_1$. Low pass filter 215 removes the sum frequency leaving difference frequency $f_0-f_1$. This difference frequency is filtered by high pass filter 220. The high pass filter determines the accuracy of the frequency accuracy indicator. For example, if the high pass filter passes frequencies above 10 Hz, then the frequency accuracy indicator indicates that the two mixer input signals have the same frequency as long as their actual frequencies differ by no more than 10 Hz.

Detector 225 rectifies the output of high pass filter 220. The detector provides a non-zero DC signal when an AC signal passes through the high pass filter and zero otherwise. Detector 225 may convert its output to a logic level; e.g. logical "1" when an AC signal is detected and logical "0" otherwise. Frequency accuracy detection is complete at this point, but a frequency accuracy indicator may include inverter 230 and AND gate 240 so that output signal 245 includes both "frequency correct" and "PLL locked" information.

Inverter 230 inverts the logic level provided by detector 225. When input frequencies $f_0$ and $f_1$ are the same within the frequency tolerance determined by high pass filter 220, the output of detector 225 is logical "0" and therefore the output of inverter 230 is logical "1". AND gate 240 combines this information with a phase lock signal 235 (where logical "0" means not phase locked and logical "1" means phase locked) to produce frequency accuracy indicator signal 245. When signal 245 is logical "1", the synthesizer to which frequency accuracy indicator 205 is connected is locked on the correct frequency.

The frequency accuracy indicator's two mixer inputs may be connected to the PLL synthesizer of FIG. 1 at connection points $S_0$ and $S_1$ as indicated in FIG. 1. Alternatively, the two inputs may be connected at connection points $S_0$ and $S_2$ as indicated in FIG. 1. The frequency at connection points $S_1$ and $S_2$ in FIG. 1 is the same during normal synthesizer operation, so the choice of which one to use is based on secondary factors or engineering convenience. The frequency at connection point $S_0$ is the frequency set by the divider loop, the so-called "correct" frequency referred to above. The frequency at connection point $S_1$ or $S_2$ is the frequency set by the mixer branch.

Figure 2B:
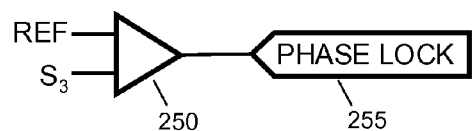
FIG. 2B is a simplified block diagram of one embodiment of a phase lock detector for providing the phase lock signal to the frequency accuracy indicator.

In FIG. 2A, phase lock signal 235 may be provided by a conventional PLL phase lock indicator. An example of how this signal may be generated is given in FIG. 2B which is a simplified block diagram of a phase lock detector. In FIG. 2B, comparator 250 compares a reference level ("REF") and a signal input, labeled "$S_3$" in the figure. The output of the comparator is phase lock signal 255. Signal $S_3$ is obtained from connection point $S_3$ as shown in FIG. 1. Connection point $S_3$ in FIG. 1 carries the tuning signal for VCO 125. The phase lock detector of FIG. 2B simply compares the VCO tuning signal to a reference level. If the levels are the same, the PLL is assumed to be locked. Of course, many other phase lock detector designs will work as well, if not better than, the simple design of FIG. 2B. For example, phase detector 110 in FIG. 1 may have a phase lock indicator output. For purposes of the frequency accuracy indicator, any phase lock detector that provides a logical "1" to indicate phase lock may be used to provide phase lock signal 235. It should be noted that the respective logic values assigned to the indication of correct frequency and/or the indication of a phase lock may be different than in the embodiments discussed above, and in alternative embodiments these logic levels may be assigned differently, with the circuits in FIGS. 2A and 2B modified accordingly if necessary, while retaining the same overall functionality as disclosed herein.

A frequency accuracy indicator has been described that monitors whether or not a dual-branch, low-noise PLL synthesizer is locked at a desired frequency. Locking to an incorrect frequency is extremely rare in normal operation; hence the frequency accuracy indicator may provide early warning of unusual circumstances or temporary failures in a synthesizer.

The above description of the disclosed embodiments is provided to enable any person skilled in the art to make or use the disclosure. Various modifications to these embodiments will be readily apparent to those skilled in the art, and the principles defined herein may be applied to other embodiments without departing from the scope of the disclosure. Thus, the disclosure is not intended to be limited to the embodiments shown herein but is to be accorded the widest scope consistent with the principles and novel features disclosed herein.

What is claimed is:

1. A phase-locked loop (PLL) frequency synthesizer comprising:
    a phase detector;
    a low pass filter coupled to the phase detector;
    an amplifier coupled to the low pass filter;
    a voltage controlled oscillator (VCO) coupled to the amplifier;
    a power splitter coupled to the VCO;
    a switch configured to select between a first branch and a second branch through which to couple the power splitter to the phase detector, the first branch comprising a frequency divider and the second branch comprising a mixer; and
    a frequency accuracy indicator configured to compare a frequency generated in the first branch to a frequency generated in the second branch.

2. The PLL frequency synthesizer of claim 1 wherein, the frequency accuracy indicator is configured to indicate that the synthesizer is locked to a desired frequency when:
    the frequency in the first branch is commensurate with the frequency generated in the second branch; and
    the frequency accuracy indicator receives a phase lock signal.

3. The PLL frequency synthesizer of claim 2 wherein, the PLL frequency synthesizer is configured to generate the phase lock signal by comparing a VCO tuning voltage to a reference level.

4. The PLL frequency synthesizer of claim 2 wherein, the phase detector is configured to generate the phase lock signal.

5. The PLL frequency synthesizer of claim 1 wherein, the frequency divider has an output configured to provide the frequency generated in the first branch.

6. The PLL frequency synthesizer of claim 1 further comprising:
    a reference frequency source; and
    a frequency divider configured to divide an output of the reference frequency source to generate a phase comparison signal for the phase detector, to determine the frequency generated in the second branch.

7. The PLL frequency synthesizer of claim 1 further comprising:
    a reference frequency source; and
    a frequency multiplier configured to multiply an output of the reference frequency source to generate a local oscillator signal for the mixer, to determine the frequency generated in the second branch.

8. The PLL frequency synthesizer of claim 1 wherein, the frequency accuracy indicator comprises:
    a mixer;
    a low pass filter coupled to the mixer, and configured to remove sum frequency mixer products;
    a high pass filter coupled to the low pass filter, and configured to determine an accuracy of the frequency accuracy indicator; and
    a detector configured to rectify an output of the high pass filter.

9. The PLL frequency synthesizer of claim 8, wherein the frequency accuracy indicator further comprises:
    an inverter configured to invert a logical output of the phase detector; and,
    an AND gate coupled to combine an output of the inverter and a logical phase lock signal.

10. A phase-locked loop (PLL) frequency synthesizer comprising:
    a phase detector; a low pass filter; an amplifier; a voltage controlled oscillator (VCO);
    an initial tuning loop comprising a frequency divider;
    a mixer loop without a frequency divider; and
    a frequency accuracy indicator;
    wherein the PLL frequency synthesizer is configured to switch between the initial tuning loop for frequency acquisition and the mixer loop for low phase-noise performance; and
    wherein the frequency accuracy indicator is configured to indicate whether the PLL frequency synthesizer is locked to a frequency determined by the divider loop when the PLL frequency synthesizer is operating with the mixer loop.

* * * * *